United States Patent
Chou

(10) Patent No.: US 6,838,912 B1
(45) Date of Patent: Jan. 4, 2005

(54) DIGITAL FRACTIONAL PHASE DETECTOR

(75) Inventor: Yu-Pin Chou, Miao-Li Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 8 days.

(21) Appl. No.: 10/609,535

(22) Filed: Jul. 1, 2003

(51) Int. Cl.[7] .............................................. H03D 13/00
(52) U.S. Cl. ................................................. 327/3; 327/10
(58) Field of Search ............................... 327/2–12, 236, 327/291, 295–296

(56) References Cited

U.S. PATENT DOCUMENTS

| 3,969,674 A | * | 7/1976 | Tracey | ........................ 375/235 |
|---|---|---|---|---|
| 4,322,852 A | * | 3/1982 | Barnes | ........................ 375/340 |
| 5,189,420 A | * | 2/1993 | Eddy et al. | ................. 341/157 |
| 5,369,404 A | * | 11/1994 | Galton | ........................ 341/143 |
| 5,553,104 A | * | 9/1996 | Takashi et al. | ............. 375/373 |
| 6,429,693 B1 | | 8/2002 | Staszewski et al. | |

FOREIGN PATENT DOCUMENTS

WO     WO 200186816 A1 * 11/2001 ........... H03L/7/083

* cited by examiner

*Primary Examiner*—Timothy P. Callahan
*Assistant Examiner*—Cassandra Cox
(74) *Attorney, Agent, or Firm*—Winston Hsu

(57) ABSTRACT

A digital fractional phase detector is shown that uses a phase error detector for generating a phase error signal based on the phase difference between a reference clock signal and a feedback clock signal. A quantizer directly measures the pulse width of a phase error signal and outputs the value in a digital form. By directly measuring the phase error signal, quantization accuracy is increased. In order to calibrate the digital fractional phase detector, a calibration pulse generator generates a calibration pulse of a known duration and passes it to the quantizer.

21 Claims, 7 Drawing Sheets

DIGITAL FRACTIONAL PHASE DETECTOR

BACKGROUND OF INVENTION

1. Field of the Invention

The invention relates to a digital fractional phase detector, and more particularly, to a digital fractional phase detector for use in a digital frequency synthesizer.

2. Description of the Prior Art

Frequency synthesizers using analog circuit techniques are well known in the art. Conventional RF frequency synthesizer architectures are analog-intensive and generally require a low loop bandwidth to reduce the familiar and well-known reference or compare frequency spurs.

The conventional PLL-based frequency synthesizers generally comprise analog-intensive circuitry that does not work very well in a low voltage constrained high-speed CMOS environment. Such frequency synthesizers do not take advantage of recently developed high-density digital gate technology.

Newer frequency synthesizer architectures have used sigma-delta modulated frequency divider techniques to randomize the above discussed frequency spurs by randomizing the spurious content at the cost of increased noise floor. These techniques have not significantly reduced the undesirable analog content. Other frequency synthesizer architectures have used direct digital synthesis (DDS) techniques that do not work at RF frequencies without a frequency conversion mechanism requiring an analog solution. Further, most previous all-digital PLL architectures rely on an over-sampling clock. Such architectures cannot be used at RF frequencies.

In view of the foregoing, it is highly desirable to have a technique to implement a digitally-intensive frequency synthesizer architecture that is compatible with modern CMOS technology and that has an accurate phase quantization resolution to accommodate wireless applications.

Staszewski et al. in U.S. Pat. No. 6,429,693 describe a digital fractional phase detector using a delay chain to measure fractional delay differences between the significant edge of a VCO output clock and a reference clock by using a time-to-digital converter to express the time difference as a digital word for use by the frequency synthesizer. However, because the VCO output clock and the reference clock are not synchronous signals with respect to each other, quantization resolution and accuracy is not optimal.

SUMMARY OF INVENTION

It is therefore a primary objective of the claimed invention to provide a digital fractional phase detector for use in high-speed RF and PLL applications that does not require an over-sampling clock and maximizes quantization resolution.

According to the claimed invention, a digital fractional phase detector comprising a phase error detector receiving a reference clock signal and a feedback clock signal, and generating a phase error signal based on the phase difference between the reference clock signal and the feedback clock signal. A quantizer is used for measuring the pulse width of the phase error signal and outputting the measurement in a digital form.

It is an advantage of the present invention digital fraction phase detector that no over-sampling clock is needed.

It is a further advantage of the claimed invention digital fractional phase detector that the quantizer directly measures the pulse width of the phase error signal output from the phase error detector.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
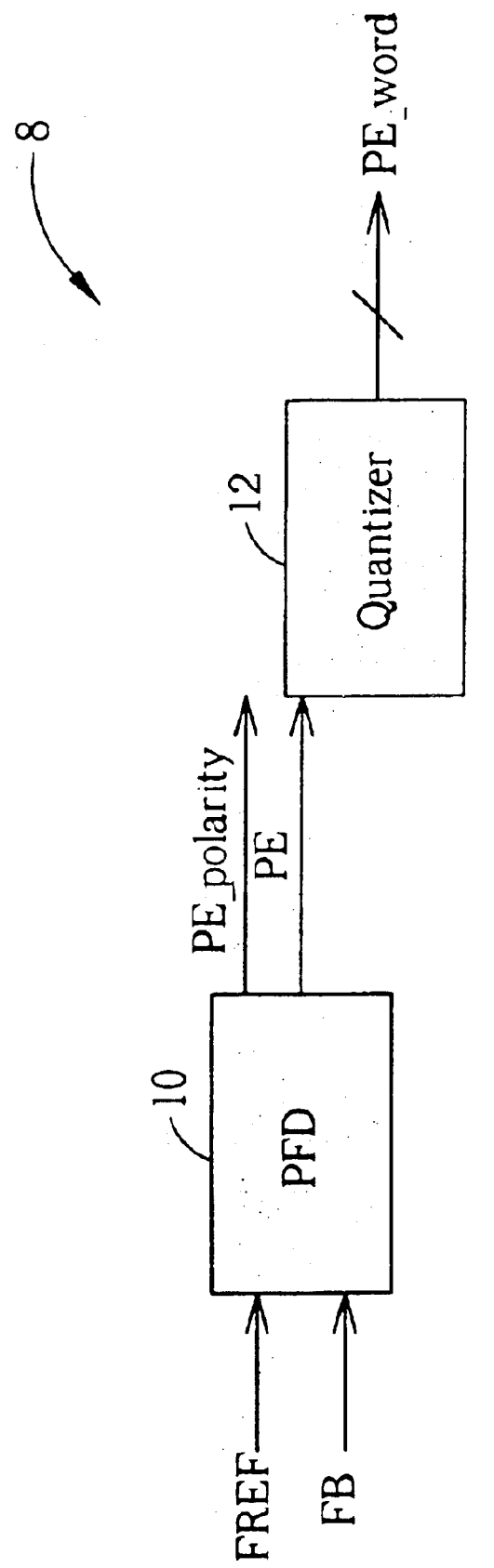
FIG. 1 is a block diagram of the digital fractional phase detector according to the first embodiment of the present invention.

FIG. 1 shows a digital fractional phase detector 8 according to the first embodiment of the present invention. The digital fractional/phase detector 8 has a phase/frequency detector (PFD) 10, which outputs a phase error signal PE and a PE-polarity signal according to the phase difference between a reference clock signal FREF and a feedback clock signal FB, and a quantizer 12 connected to the phase/frequency detector (PFD) 10. The pulse width of the phase error signal PE corresponds to the phase difference between the reference clock signal FREF and the feedback clock signal FB and the polarity of the PE-polarity signal is for determining whether the feedback clock signal FB is leading (or lagging) the reference clock signal FREF. The quantizer 12 measures the pulse width of the phase error signal PE and outputs a digital pulse width value PE_word according to the measurement.

Figure 2:
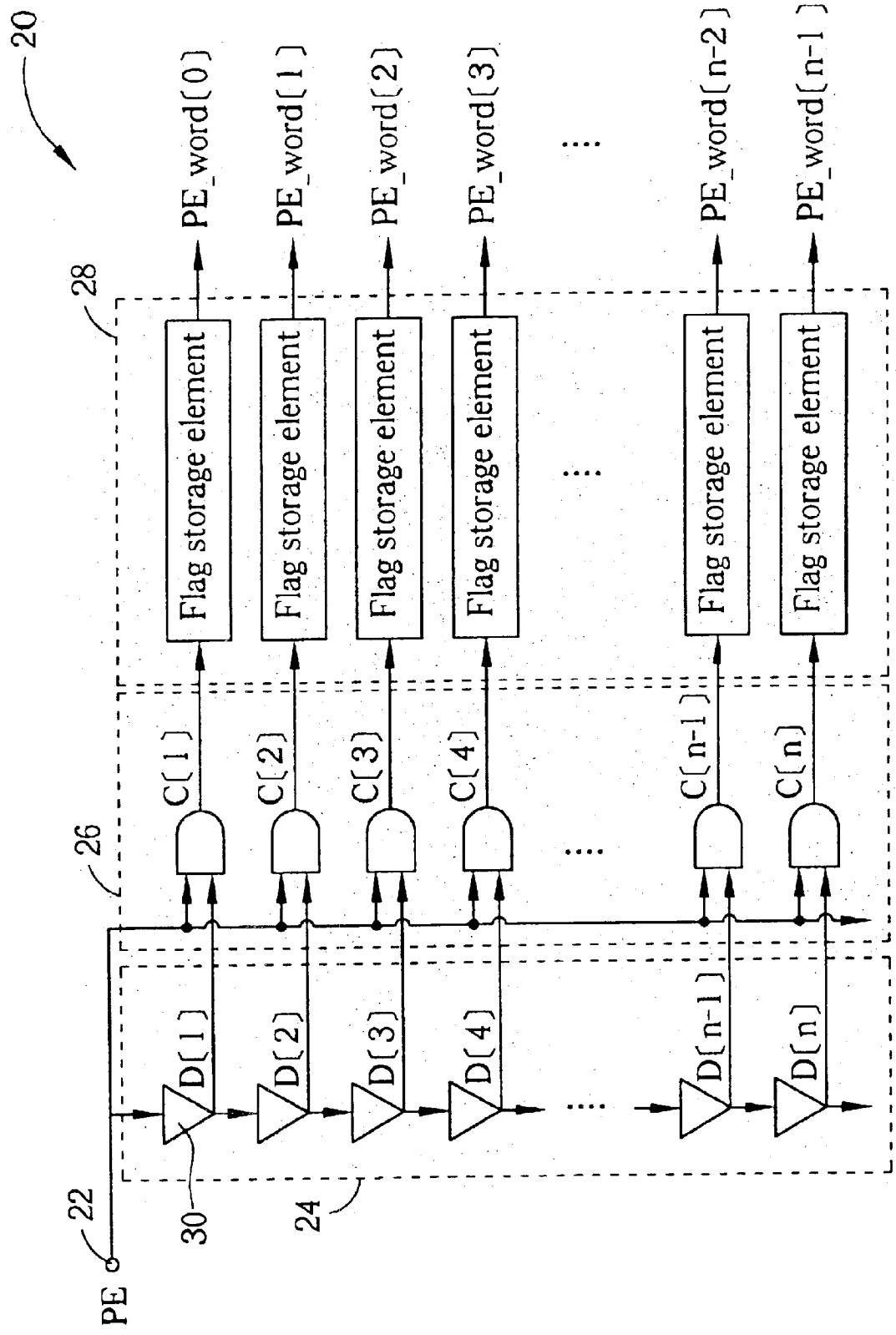
FIG. 2 is a gate-level diagram of a first implementation of the quantizer shown in FIG. 1.

FIG. 2 shows a gate-level diagram of a quantizer 20 that is an embodiment of the quantizer 12 shown in FIG. 1. In this implementation the quantizer 20 comprises a phase error input terminal 22, a plurality of delay elements 24, a plurality of comparing elements 26, and a plurality of flag storage elements 28. The phase error signal PE is received by the first delay element 30 of the delay elements 24 and each of the comparing elements through the phase error input terminal 22. In this implementation of the quantizer 20, each of the delay elements is a buffer and each of the comparing elements is an AND-gate. Since the delay elements 24 are serially-connected buffers, for each delay element, the phase of the outputting signal are different and corresponded to the number of the delay element(s) that the phase error signal PE is passed through from the first delay element 30. Therefore, for each delayed phase error signal D[1] to D[n], the phase delay between the phase error signal PE and the delayed phase error signal is different. The output of each delay element D[1] to D[n] is output to a corresponding comparing element. Each AND-gate is for comparing the phase error signal PE with a corresponding delayed phase error signal D[n]. The output signals C[1] to C[n] of the comparator elements are stored in the corresponding flag storage elements. In this implementation of the quantizer 20, each of the flag storage elements comprises a Latch, which allows the received phase error PE pulse width signal to be read at a later time.

Figure 3:
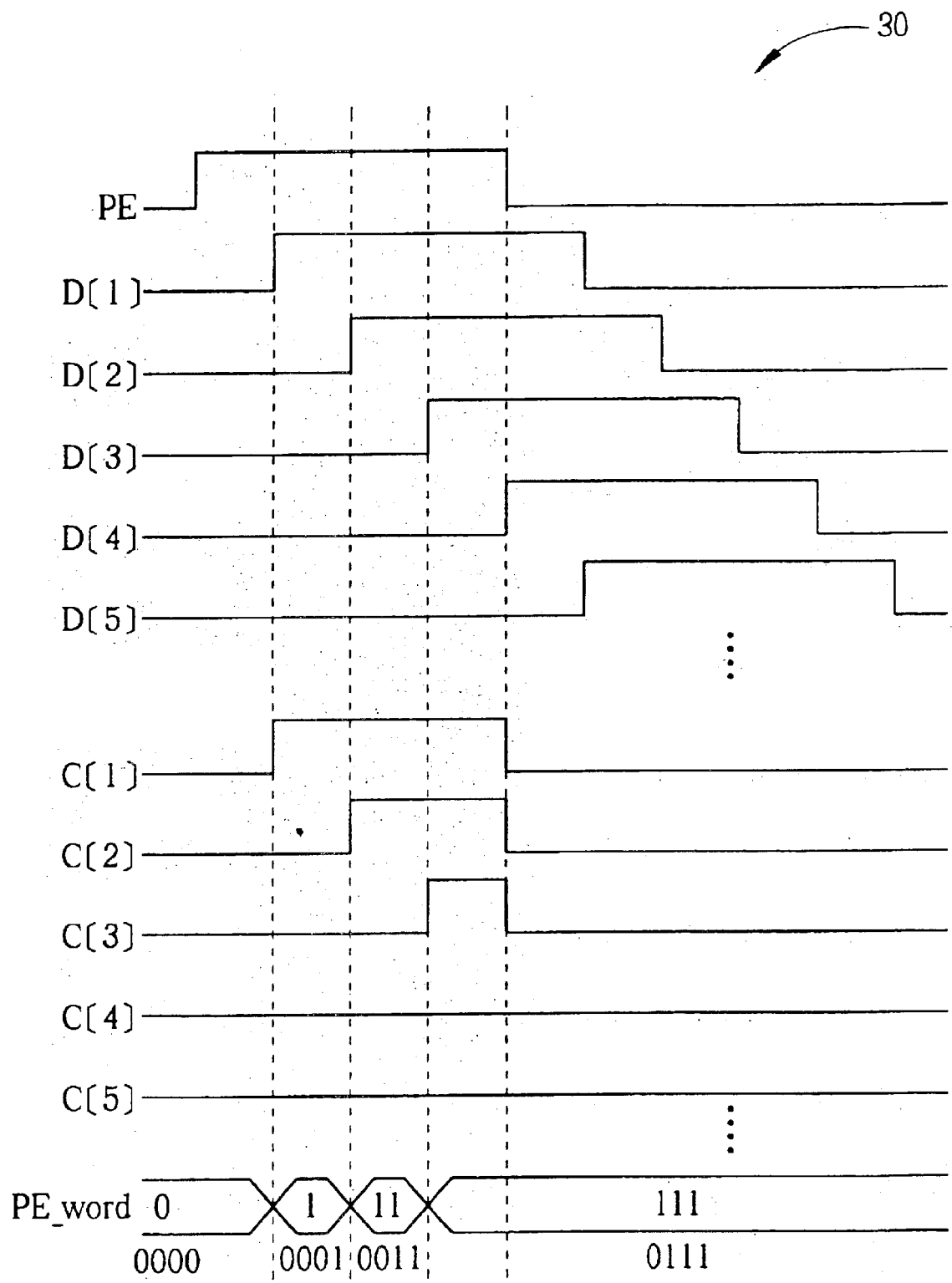
FIG. 3 is a timing diagram for the quantizer shown in FIG. 2.

FIG. 3 shows a timing diagram 30 for the quantizer 20 of FIG. 2. When the phase error signal PE is a logic high, each of the delay elements will output the corresponding delayed phase error signal. The waveform of delayed phase error signals D[1] to D[n] is the same with the phase error signal PE. However, as shown in FIG. 3, the phase delay between each delayed phase error signal D[1] to D[n] and the phase error signal PE is different. The output signal of comparing elements C[1] to C[n] is generated according to the phase error signal PE and the corresponding delayed phase error signal D[1] to D[n] shown in FIG. 3. Because the phase error signal PE has a pulse width of four times the delay time of a single delay element, the first three comparator elements assert a logic high on their flag lines C[1], C[2], C[3] when comparing the phase error signal PE with the increasingly delayed phase error signal D[1], D[2], D[3] respectively. Because by the time the forth comparator element receives the delayed phase error signal D[4] the original phase error signal PE has already dropped to a logic zero, the forth comparator element does not assert a logic high on its flag line C[4]. When the phase error signal PE is a logic high, all subsequent comparator elements thereafter do not assert their flag lines C[4] to C[n] to be logic high if the state of the receiving delayed signal D[4] to D[n] is not logic high. The phase error word PE_word is made up of the outputs from the flag storage lines for all the comparator elements. The least significant bit PE_word[0] is the output from the first flag storage element, the next significant bit PE_word[1] is from the second flag storage element, and so on until the last flag storage element PE_word[n−1] forms the most significant bit. By comparing the phase error signal PE with delayed versions of itself, the PE signal pulse width is measured with a resolution directly specified by the delay unit associated with each delay element. Because the PE signal is directly compared with delayed versions of itself, a more accurate quantization result is obtained.

Figure 4:
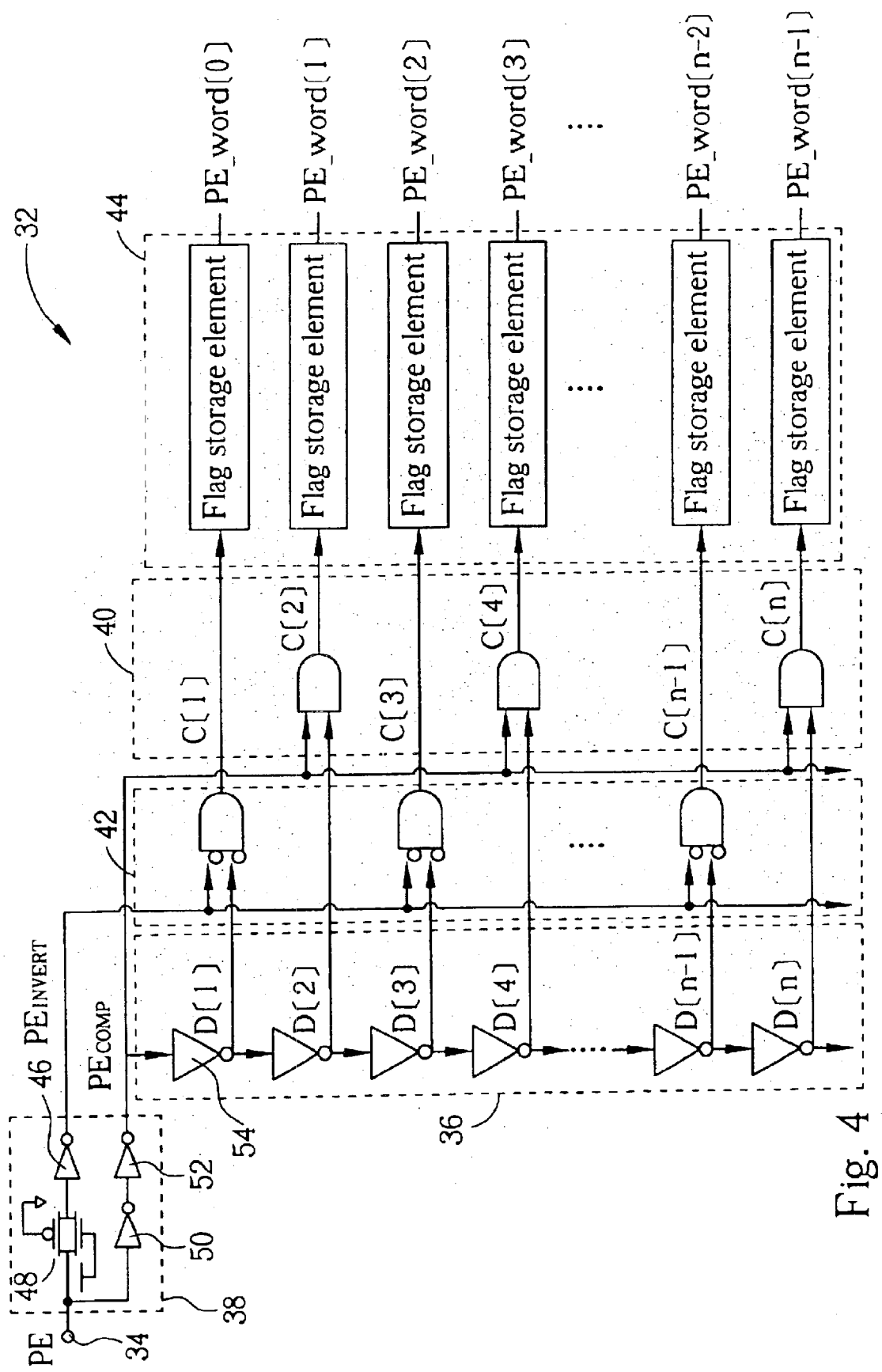
FIG. 4 is a gate-level diagram of a second implementation of the quantizer shown in FIG. 1.
Figure 5:
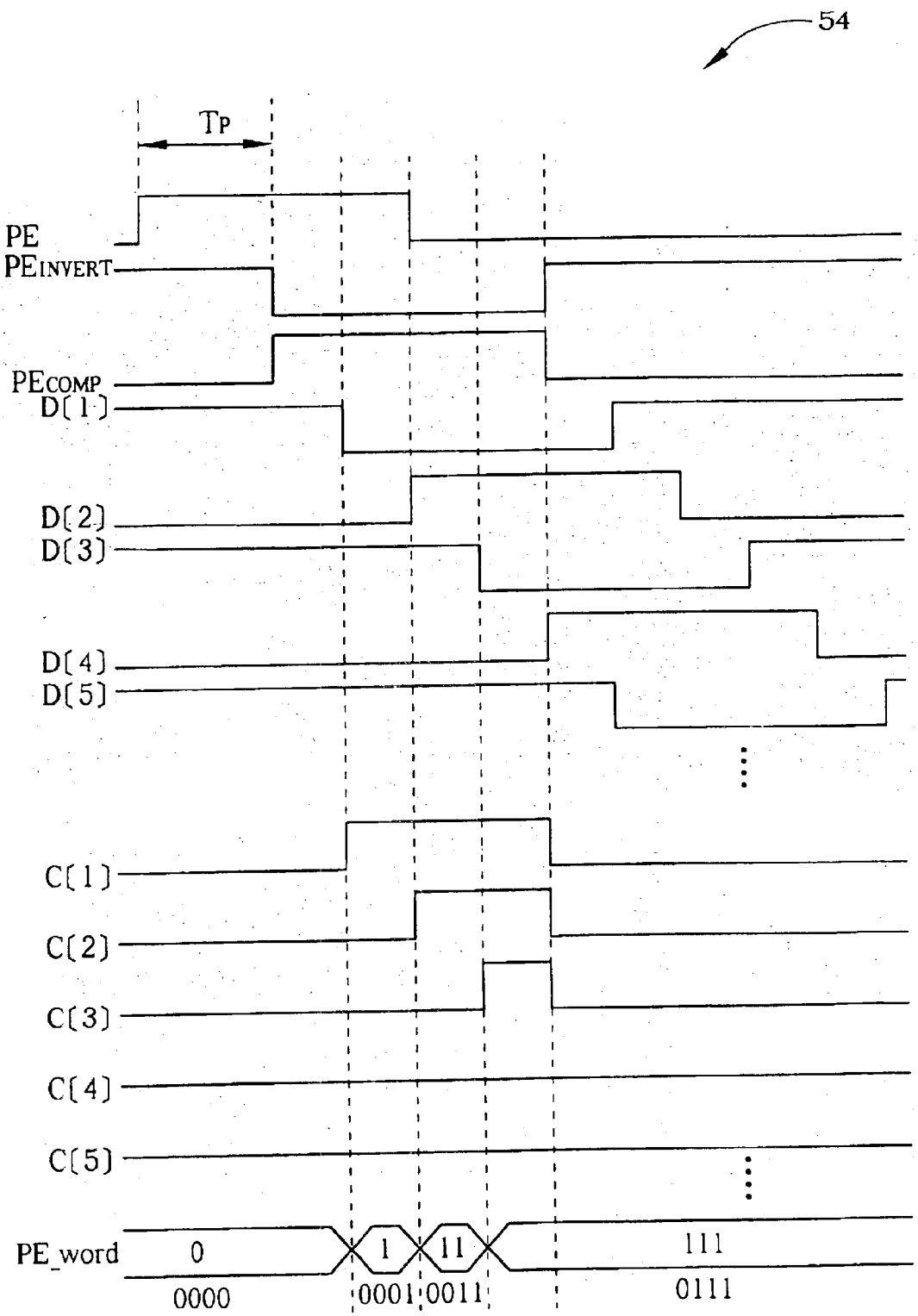
FIG. 5 is a timing diagram for the quantizer shown in FIG. 4

FIG. 4 shows a gate-level diagram of a second embodiment of the quantizer 32. In this implementation the quantizer 32 comprises a phase error input terminal 34, a compensator circuit 38, a plurality of delay elements 36, a plurality of even comparator elements 40, a plurality of odd comparator elements 42, and a plurality of flag storage elements 44. The compensator circuit 38 has a first output terminal for outputting a compensated phase error signal $PE_{COMP}$ and a second output terminal for outputting an inverted phase error signal $PE_{INVERT}$ according to phase error signal PE. The compensated phase error signal $PE_{COMP}$ is delayed by the same amount of time that the inverted phase error signal $PE_{INVERT}$ is delayed due to being inverted. As shown in FIG. 5 an inverter 46 connected in series with a transmission gate 48 can be used to generate the inverted phase error signal $PE_{INVERT}$ and two inverters 50, 52 connected in series can be used to generate the compensated phase error signal $PE_{COMP}$.

The compensated phase error signal $PE_{COMP}$ is connected to the first delay element 54 of the delay elements 36. In this embodiment, inverters are used as the delay elements. Since the output signal and the input signal of an inverter is inverted, the output signal of the first, third, fifth, etc inverters D[1], D[3], D[5], etc and that of the second, fourth, sixth, etc inverters D[2], D[4], D[6], etc are inverted with respect to each other. The comparing elements comprise a plurality of odd comparing elements 42 and a plurality of even comparing elements 40. Each even comparing element in the plurality of even comparing elements 40 has two input terminals for receiving the compensated phase error signal $PE_{COMP}$ and the delayed phase error signal D[2], D[4], etc, respectively. Each odd comparing elements in the plurality of odd comparing elements 42 has two input terminals for receiving the inverted phase error signal $PE_{INVERT}$ and the delayed/inverted phase error signal D[1], D[3], etc, respectively. In this implementation of the quantizer 32, the plurality of even comparing elements 40 is made up of AND-gates and the plurality of odd comparing elements 42 is made up of NOR-gates. Each even comparing element in the plurality of even comparator elements 40 compares the compensated phase error signal $PE_{COMP}$ to a delayed version of itself. Each odd comparing element in the plurality of odd comparator elements 42 compares the inverted phase error signal $PE_{INVERT}$ to a delayed and inverted version of the compensated phase error signal $PE_{COMP}$. The asserted flag signal of each comparator element C[1] to C[n] can be stored in a flag storage element allowing the phase error signal PE pulse width value PE_word to be read at a later time.

FIG. 5 shows a timing diagram 54 for the quantizer 32 of FIG. 4. The phase error signal PE has a pulse width of just over four times the delay time of a single delay element. The inverted phase error signal $PE_{INVERT}$ and the compensated phase error signal $PE_{COMP}$ generated by the compensator circuit 38 are both delayed by the same delay time. The first comparing element (a NOR-gate) asserts a logic high on the flag line C[1] when comparing the inverted phase error signal $PE_{INVERT}$ with the delayed phase error signal D[1]. The second comparing element (an AND-gate) asserts a logic high on the flag line C[2] when comparing the compensated phase error signal $PE_{COMP}$ with the delayed phase error signal D[2]. It should be noted that the phase of the delayed phase error signal D[2] is delayed to D[1] by one delay time and the delayed phase error signal D[2] and D[1] are inverted. The third comparing element (a NOR-gate) asserts a logic high on the flag line C[3] when comparing the inverted phase error signal $PE_{INVERT}$ with the delayed phase error signal D[3]. Because by the time the forth comparing element (an AND-gate) receives the delayed phase error signal D[4], the compensated phase error signal $PE_{COMP}$ has already dropped to a logic low, the forth comparing element does not assert a logic high on its flag line C[4]. All subsequent comparing elements thereafter also do not receive the inverted phase error signal $PE_{INVERT}$ or compensated phase error signal $PE_{COMP}$ and the delayed phase error signal at the same time and therefore do not assert their flag lines D[4] to D[n]. The phase error word PE_word is made up of the outputs from the flag storage lines for all the comparing elements. The least significant bit is the output from the first flag storage element PE_word[0], the next significant bit is from the second flag storage element PE_word[1], and so on until the last flag storage element forms the most significant bit PE_word[n−1].

Figure 6:
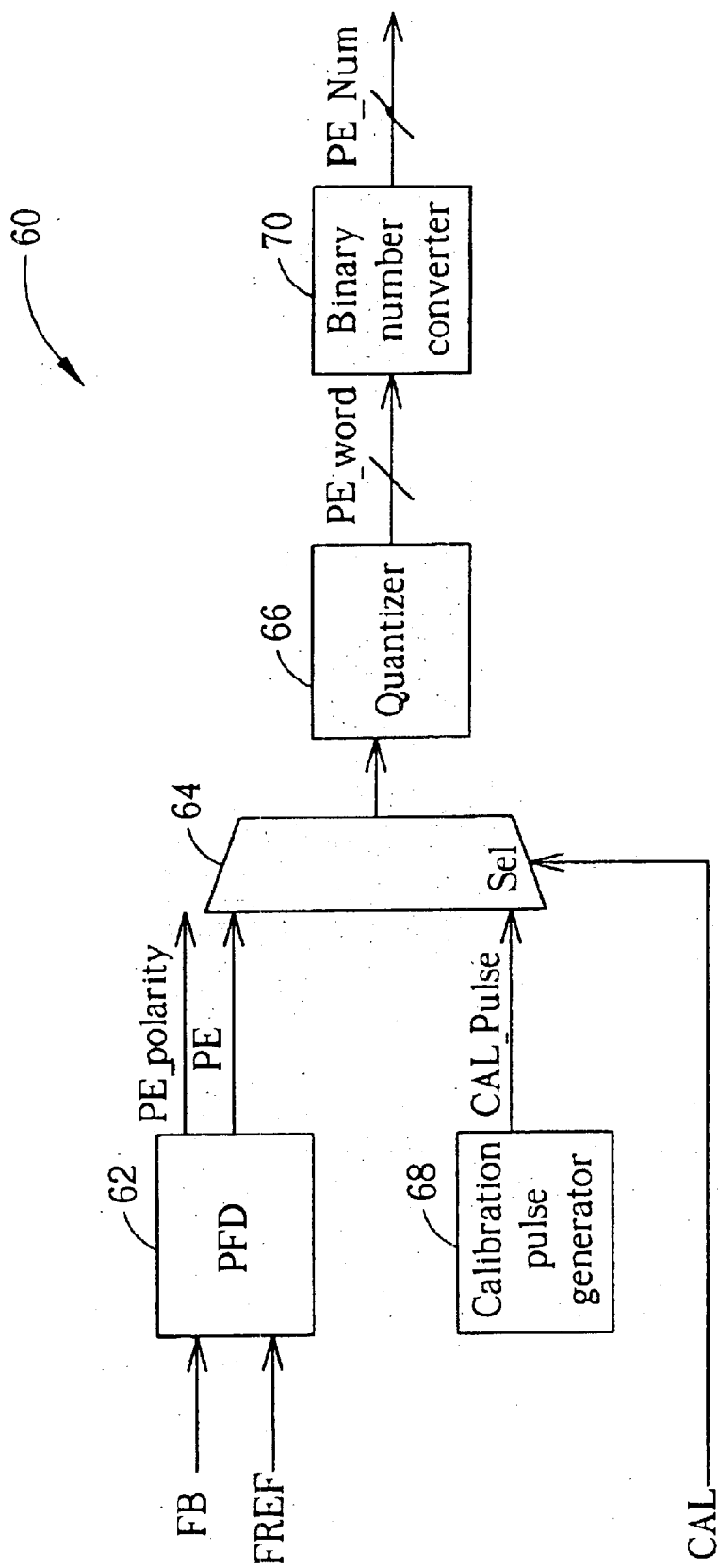
FIG. 6 is a block diagram of the digital fractional phase detector according to the second embodiment of the present invention.

FIG. 6 shows a digital fractional phase detector 60 according to the second embodiment of the present invention. The digital fraction phase detector 60 comprises a PFD 62 and a calibration pulse generator 68 connected to a multiplexer 64. The multiplexer selectively connects either the PFD 62 or the calibration pulse generator 68 to a quantizer 66 and the quantizer 66 is connected to a binary number converter 70.

The digital fractional phase detector 60 has as inputs a reference clock signal FREF and a feedback clock signal FB, which are input into the PFD 62. The PFD 62 measures the phase difference between the two clock signals FREF, FB and generates a phase error signal PE and a polarity of the phase error signal PE_polarity. The multiplexer 64 is used to selectively connect either the phase error signal PE or a calibration pulse of a known duration CAL_Pulse to the quantizer 66 depending on a calibration signal CAL. The quantizer 66 measures the pulse width of the received signal, either the calibration pulse of a known duration CAL_Pulse or the phase error signal PE, and outputs the pulse width value in a digital form PE_word. The calibration pulse generator 68 generates the calibration pulse of a known duration CAL_Pulse. The binary number converter 70 converts the output PE_word from the quantizer 66 into a binary number PE_Num representing the number of delay elements that make up the pulse width of the phase received by the quantizer 66. Both the quantizer circuits of FIG. 2 or FIG. 4 can be used to implement the quantizer 66 for use with the second embodiment of the present invention.

The second embodiment of the present invention adds some additional features not included in the first embodiment including the ability to adjust for process deviation causing delay element timing variations between physical versions of the digital fractional phase detector 60. Small process variations typically result due to different integrated circuit (IC) fabrications. During calibration, indicated by the calibration signal CAL, the calibration pulse generator 68 generates a calibrate pulse of a known duration CAL_Pulse. The multiplexer 64 connects the calibration pulse CAL_Pulse to the quantizer and the quantizer measures the pulse width of the calibration pulse of known duration CAL_Pulse and outputs a digital value PE_word that is converted by the binary number converter 70 into a number PE_Num representing the width of the pulse in units of delay element time. For example if the first three comparator elements all assert their flag signals, the final output of the binary number converter 70 PE_Num will be a three. If the first eight comparator elements all assert their flag signals, the output of the binary number converter 70 PE_Num will be an eight. Because the duration of the calibration pulse CAL_Pulse is known, a simple calculation can be performed to determine the exact delay time of each delay element on this particular physical IC.

Figure 7:
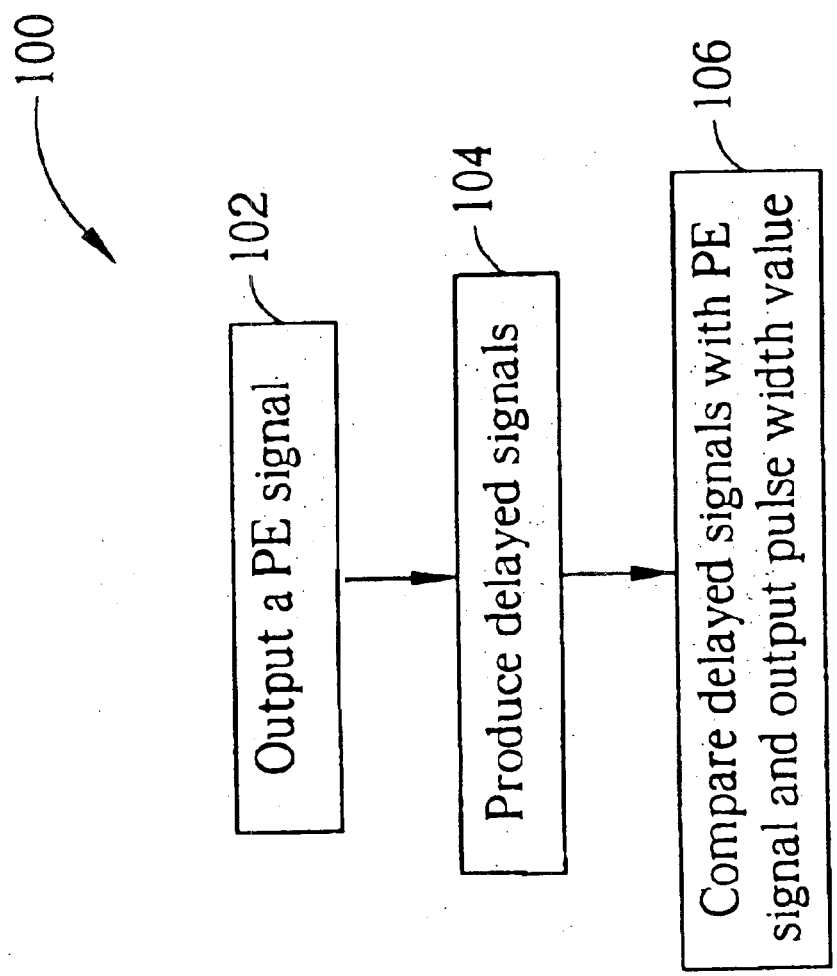
FIG. 7 is a flowchart diagram describing the method for detecting a digital fractional phase difference between a reference clock signal and a feedback clock signal according to the present invention.

FIG. 7 shows a flowchart 100 describing the present invention method for detecting a digital fractional phase difference between a reference clock signal and a feedback clock signal. The flowchart 100 includes the following steps:

Step 102: Output a PE signal. A phase error detector receives the reference clock signal and the feedback clock signal and generates the PE signal based on the phase difference between the reference clock signal and the feedback clock signal.

Step 104: Produce delayed PE signals. A plurality of delay elements is connected together to generate a plurality of delayed PE signals according to the PE signal.

Step 106: Compare delayed PE signals with PE signal and output pulse width value. A plurality of comparator elements compare the delayed PE signals with the PE signal and output the measurement in a digital form.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A digital fractional phase detector comprising:
a phase error detector for receiving a reference signal and an inputting signal, and generating a phase error signal based on the phase difference between the reference signal and the inputting clock signal; and
a quantizer coupled to the phase error detector for producing a plurality of delayed signals according to the phase error signal, and outputting a pulse width signal according to the phase error signal and the delayed signals, wherein each of the delayed signals has a corresponding phase.

2. The digital fractional phase detector of claim 1 wherein the quantizer further comprises:
a plurality of delay elements for generating the delayed signals; and
a plurality of comparator elements for outputting the pulse width signal.

3. The digital fractional phase detector of claim 2, wherein each of the delay elements comprises a buffer.

4. The digital fractional phase detector of claim 2, wherein the quantizer further comprises a plurality of flag storage elements for storing the pulse width signal.

5. The digital fractional phase detector of claim 4, wherein each of the flag storage elements comprises a Latch.

6. The digital fractional phase detector of claim 1, further comprising a binary number converter for converting the pulse width signal into a binary form.

7. The digital fractional phase detector of claim 1, further comprising a multiplexer for selectively outputting the phase error signal and a calibrating pulse according to a calibration signal.

8. The digital fractional phase detector of claim 7, wherein the calibration pulse is provided by a calibration pulse generator.

9. A quantizer, comprising:
a plurality of delay elements for producing a plurality of delayed signals according to a inputting signal, wherein each of the delayed signals has a corresponding phase; and
a plurality of comparing elements for outputting a pulse width signal according to the inputting signal and the delayed signals, wherein each of the comparing elements is connected to one of the delay elements.

10. The quantizer of claim 9, wherein each of the delay elements comprises a buffer.

11. The quantizer of claim 10, wherein the delay elements are serially connected.

12. The quantizer of claim 9, further comprising a plurality of flag storage elements for storing the pulse width signal.

13. The quantizer of claim 12, wherein each of the flag storage elements comprises a latch.

14. The quantizer of claim 9, wherein each of the delay elements comprises an inverter.

15. The quantizer of claim 14, wherein the delay elements are serially connected.

16. The quantizer of claim 15, wherein the plurality of comparing elements further includes a plurality of first comparing elements and a plurality of second comparing elements.

17. The quantizer of claim 16, wherein each of the first comparing elements is adjacent to at least one of the second comparing elements.

18. The quantizer of claim 16, wherein each of the first comparing elements is an AND-gate.

19. The quantizer of claim 16, wherein each of the second comparing elements is a NOR-gate.

20. A method for detecting a phase difference between a reference signal and an inputting signal, comprising:
outputting a phase error signal according to the phase difference between the reference signal and the inputting signal;
producing a plurality of delayed signals according to the phase error signal, wherein each of the delayed signals has a corresponding phase; and
outputting a pulse width signal according to a comparison of the phase error signal and each of the delayed signals.

21. The method of claim 20 further comprising converting the pulse width signal into a binary form.

* * * * *